US006957414B2

(12) United States Patent
Ludwig et al.

(10) Patent No.: US 6,957,414 B2
(45) Date of Patent: Oct. 18, 2005

(54) METHOD FOR DETERMINING THE ABILITY TO PROJECT IMAGES OF INTEGRATED SEMICONDUCTOR CIRCUITS ONTO ALTERNATING PHASE MASKS

(75) Inventors: Burkhard Ludwig, München (DE); Molela Moukara, München (DE)

(73) Assignee: Infineon Technologies AG, Munich (DE)

( * ) Notice: Subject to any disclaimer, the term of this patent is extended or adjusted under 35 U.S.C. 154(b) by 268 days.

(21) Appl. No.: 10/352,735

(22) Filed: Jan. 27, 2003

(65) Prior Publication Data

US 2003/0140331 A1 Jul. 24, 2003

Related U.S. Application Data

(63) Continuation of application No. PCT/DE01/02878, filed on Jul. 25, 2001.

(30) Foreign Application Priority Data

| Jul. 26, 2000 | (DE) | ......................................... 100 37 444 |
| Nov. 20, 2000 | (DE) | ......................................... 100 57 438 |
| Nov. 20, 2000 | (DE) | ......................................... 100 57 437 |

(51) Int. Cl.[7] ............................. G06F 17/50; G03F 9/00
(52) U.S. Cl. ................................ 716/19; 716/21; 430/5
(58) Field of Search .......................... 716/19–21; 430/5, 430/311–324

(56) References Cited

U.S. PATENT DOCUMENTS

| 5,537,648 A |   | 7/1996  | Liebmann et al. |        |
| 5,923,566 A |   | 7/1999  | Galan et al.    |        |
| 5,994,002 A | * | 11/1999 | Matsuoka ........................ | 430/5 |
| 6,057,063 A | * | 5/2000  | Liebmann et al. ............. | 430/5 |
| 6,185,727 B1 | * | 2/2001  | Liebmann ..................... | 716/19 |
| 6,493,866 B1 | * | 12/2002 | Mayhew ....................... | 716/21 |
| 6,524,752 B1 | * | 2/2003  | Pierrat ............................ | 430/5 |
| 6,543,045 B2 | * | 4/2003  | Ludwig et al. ............... | 716/21 |
| 6,795,961 B2 | * | 9/2004  | Liebmann et al. ............ | 716/19 |
| 6,811,935 B2 | * | 11/2004 | Pierrat ........................... | 430/5 |
| 6,811,954 B1 | * | 11/2004 | Fukuda ....................... | 430/311 |
| 2004/0191650 A1 | * | 9/2004 | Pierrat ............................ | 430/5 |
| 2004/0202965 A1 | * | 10/2004 | Pierrat et al. ............... | 430/311 |

OTHER PUBLICATIONS

Levenson, M.D. et al.: "Improving Resolution in Photolithography with a Phase–Shifting Mask", IEEE Transactions on Electron Devices, vol. ED–29, No. 12, 1982, pp. 1828–1836.
Levenson, M.D.: "Wavefront Engineering for Photolithography", Physics Today, 1993, pp. 28–36.
Widmann, D. et al.: "Technologie Hochintegrierter Schaltungen" [Technology of Large–Scale Integrated Density Circuits], Springer, 2nd Edition, pp. 135–138.
Moniwa, A. et al.: "Heuristic Method for Phase–Conflict Minimization in Automatic Phase–Shift Mask Design", Japanese Journal of Applied Physics, 1995, pp. 6584–6589.

* cited by examiner

*Primary Examiner*—A. M. Thompson
*Assistant Examiner*—Magid Y. Dimyan
(74) *Attorney, Agent, or Firm*—Laurence A. Greenberg; Werner H. Stemer; Ralph E. Locher (57) ABSTRACT

A method is used to check the direct convertibility of integrated semiconductor circuits into alternating phase masks. This is done by explicitly localizing the phase conflicts occurring in the corresponding layout while solely using the technological requirements made of the design. The set of phase conflicts determined with the aid of this formalism is complete and minimal and thus proves to be an optimum starting point for methods for handling conflicts of this type.

14 Claims, 12 Drawing Sheets

METHOD FOR DETERMINING THE ABILITY TO PROJECT IMAGES OF INTEGRATED SEMICONDUCTOR CIRCUITS ONTO ALTERNATING PHASE MASKS

CROSS-REFERENCE TO RELATED APPLICATION

This application is a continuation of copending International Application No. PCT/DE01/02878, filed Jul. 25, 2001, which designated the United States and was not published in English.

BACKGROUND OF THE INVENTION

Field of the Invention

The invention generally concerns the field of fabricating integrated semiconductor circuits such as VLSI and ULSI circuits by photolithographic methods. In particular, the invention relates to increasing the resolution of conventional photolithography by using alternating phase masks.

During the fabrication of integrated semiconductor circuits, the mask structures assigned to the circuit elements are optically imaged onto light-sensitive layers on the wafer in a conventional manner. On account of the diffraction effects, the resolution of an image projection system of this type is limited and mask structures having dimensions less than the reciprocal value of the resolution, the so-called critical structures, are imaged in a blurred or indistinct manner. This leads to undesirable strong correlations between the circuit elements and thus to an impairment of the circuit functionality.

These difficulties can be overcome by utilizing the destructive interference effect of two closely adjacent and coherent light beams having phases shifted by 180° and by converting the affected conventional masks into alternating phase masks in which each critical structure is provided with two phase shifters for generating the required phase shift.

The various types of phase masks are described for example in the book titled "Technologie hochintegrierter Schaltungen" ["Technology of Large Scale Integrated Circuits] by D. Widmann, H. Mader and H. Friedrich, 2nd edition, Springer-Verlag, page 135 et seq. An extensive overview of phase mask technology is contained in the publications titled "Improving Resolution in Photolithography with a Phase-Shifting Mask" by M. D. Levenson et al. in IEEE Trans. Electron. Devices 29 (1982), 1828 et seq. and "Wavefront Engineering for Photolithography" by M. D. Levenson in Physics Today, July 1993, page 28 et seq.

The use of so-called strong phase masks, which include both the alternating phase masks already mentioned and chromiumless phase masks, requires the transparent phase-shifting structures, in each affected plane, to be allocated to one of two phases having a phase difference $\Delta\phi=180°$. It is necessary to distinguish between the following two cases. In the case of a so-called dark-field phase mask, transparent structures correspond to the circuit elements (e.g. interconnects) and phases can be allocated to them, while nontransparent mask fields are formed by regions covered with chromium. By contrast, in the case of a so-called bright-field phase mask, the chromium-covered nontransparent regions of the phase mask represent the circuit elements and the intervening regions are transparent. In the latter case, it is necessary to determine suitable regions in the vicinity of the nontransparent chromium regions as phase-shifting elements. The creation of the phase-shifting elements is effected according to specific design rules known per se in the prior art and is described in U.S. Pat. No. 5,537,648, for example, which is hereby incorporated by reference into the disclosure content of the present application.

In view of the complexity of modern circuits and the demand for two phase-shifting elements shifted by 180° at each critical structure, phase conflicts are conceivable, however. A phase conflict is present precisely when the phase shifters on both sides of a critical structure are incorrectly allocated the same phase, or when the destructive interference effect occurs at an undesirable location on the light-sensitive layer already mentioned, on account of the interaction of the phase-shifting elements. The phase allocation for the different phase-shifting elements thus represents a mathematical-combinatorial problem that cannot generally be solved. Since, in principle, the phase allocation can lead to different results and different phase allocations can be effected for one and the same cell of a hierarchical layout, the phase allocation has to be performed in an automated program finally on the finished circuit layout. An automated checking routine is required, therefore, which examines a circuit layout to ascertain whether a phase allocation is actually possible. The check is intended to be complete and to localize the problem location as well as possible, i.e. ascertain its actual place of origin. This is not self-evident because if the combinatorial task "does not work out", then this is possible in diverse ways and the location at which this is found to be the case may be far from the actual place of origin.

Once phase conflicts have been determined in an automated routine, they can be resolved in two fundamentally different ways. First, the circuit configuration can be slightly altered at the locations of the localized phase conflicts, for example by shifting interconnect structures, thereby eliminating the phase conflicts. On the basis of the altered circuit configuration it is then possible to carry out a successful phase allocation for the creation of a phase mask. Second, the circuit configuration can remain unchanged and the phase conflicts are instead resolved by allocating two different phases to individual phase-shifting elements. The consequence of this, however, is that a dark line occurs during the exposure at the boundary line between the two different phase regions that would lead to an interruption. In this case, therefore, it is necessary to carry out an additional exposure step with a so-called trimming mask through which the dark lines that occur are specially exposed.

Two different methods for checking a layout for phase conflicts are known in the prior art.

The publication titled "Heuristic Method for Phase-Conflict Minimization in Automatic Phase-Shift Mask Design" by A. Moniwa et al. in Jpn. J. Appl. Phys., Vol. 34 (1995) pp. 6584–6589 (D2), discloses a graph theory approach in which a set of phase-shifting elements is assumed and a planar non-directional graph is formed from this set taking account of the technological requirements. In the graph theory method, graph nodes (vertices) represent phase-shifting elements. A graph edge between two nodes means that the region between the associated phase shifters is lithographically critical. In this method, phase conflicts emerge as those cycles with an odd number of vertices. On the basis of the meaning of the graph edges, a cycle breaking, i.e. resolution of a phase conflict, is equivalent to a widening of the corresponding critical region. According to the method mentioned, an efficient conflict resolution strategy consists in breaking the edges that occur most often in the odd cycles.

U.S. Pat. No. 5,923,566 describes a computer-implemented route that verifies whether an existing circuit configuration can be imaged onto a phase mask or whether localized phase conflicts are present. The phase conflicts are detected from the interaction of critical circuit regions with the contiguous free circuit regions that are to be determined taking account of the technological requirements. Free circuit regions with an odd number of interactions represent the phase conflicts.

Both of the methods described above do not work optimally in the detection of phase conflicts, however. As will be explained below using examples, these two methods first prove to be inefficient since, by way of example, specific phase conflicts are indicated doubly in the case of the methods. Second, they prove to be inadequate since specific other phase conflicts cannot be detected by the methods.

SUMMARY OF THE INVENTION

It is accordingly an object of the invention to provide a method for determining the ability to project images of integrated semiconductor circuits onto alternating phase masks that overcomes the above-mentioned disadvantages of the prior art methods of this general type. Consequently, it is an object of the present invention to specify a method for determining the ability to project images of integrated semiconductor circuits onto alternating phase masks and for determining possible phase conflicts by which, solely using the technological requirements made of the circuit structure, an existing set of phase conflicts can be determined completely and minimally. After the phase conflicts have been determined, they are intended to be resolved and a layout for a phase mask is intended to be created.

In a first aspect of the present invention, the method according to the invention is applied to a dark-field phase mask, the intention thus being to project images of circuit elements such as electrical interconnects into transparent regions of the phase mask.

In the method, in a first step, critical regions are determined in which in each case two adjacent transparent regions provided for the phase mask fall below a specific predetermined minimum distance from one another.

In a second method step, overlap regions between straight sections of the critical regions obtained and end regions of straight sections of the critical regions, which straight sections end in the midst of transparent regions, are determined and degenerate critical regions are generated. The latter are obtained by subtracting overlap regions from the critical regions.

In a third method step, contiguous regions (lands) lying outside the transparent and the critical regions are then determined, and outer boundaries of the lands and of the overlap regions and end regions obtained in the preceding method step are determined. In a fourth method step, from each of the outer boundaries determined, the number of stretches of contact with the degenerate critical regions is then determined and, in the event of an odd number, a phase conflict is determined.

In a second aspect of the present invention, the method according to the invention is applied to a bright-field phase mask, the intention thus being to project images of circuit elements such as electrical interconnects into nontransparent regions of the phase mask.

In this method, in a first method step, phase-shifting regions are determined in each case on both sides of nontransparent, critical regions provided for the phase mask. Critical regions are defined by the fact that they fall below a predetermined structure width.

In a second method step, overlap regions between straight sections of the critical regions and end regions of straight sections of the critical regions, which straight sections end in the midst of phase-shifting regions or interaction regions between phase-shifting regions, are then determined and degenerate critical regions are generated. The latter are obtained by subtracting overlap regions from the critical regions.

In a third method step, contiguous regions (lands) lying outside the phase-shifting and critical regions are determined, and outer boundaries of the lands and of the overlap regions and end regions obtained in the preceding method step are determined.

Finally, in a fourth method step, from each of the outer boundaries determined, the number of stretches of contact with the degenerate critical regions is determined and, in the event of an odd number, a phase conflict is determined.

The present invention thus represents a formalism that can be used to check the direct convertibility of integrated semiconductor circuits into alternating phase masks, to be precise both dark-field and bright-field phase masks. This is done by explicitly localizing the phase conflicts occurring in the corresponding layout while solely using the technological requirements made of the design. The set of phase conflicts determined with the aid of this formalism is complete and minimal, i.e. all existing phase conflicts are always ascertained and existing phase conflicts are not indicated multiply, for instance.

The invention further concerns, in particular, methods for handling phase conflicts of this type for which the formalism according to the invention is an optimum starting point. Examples of methods of this type are the method based on the trimming masks already mentioned, which method is well known per se and in which method a further exposure step has to be carried out, multiphase mask technology, which is likewise known per se in the prior art, and the definition of changes in the layout geometry for eliminating layout structures with lithographically critical dimensions.

A further favorable property of the formalism according to the invention is that it is suitable in particular for implementation in a hierarchical DRC tool.

The method according to the invention can also perfectly well be employed for chromiumless phase masks.

In accordance with an added mode of the invention, there are the steps of resolving the phase conflict by allocating two different phases with a phase difference $\Delta\phi=180°$ to a respective transparent region (alternatively a respective phase-shifting element) involved in the phase conflict, and carrying out an exposure step for exposing a boundary line between two phase regions.

In accordance with an additional mode of the invention, there is the step of resolving the phase conflict by altering a circuit structure.

In accordance with another mode of the invention, there is the step of resolving the phase conflict by using more than two different phases.

In accordance with a concomitant mode the invention, there is the step of visualizing the phase conflict on a display device by highlighting polygons or an outer contour corresponding to the phase conflict. A screen is preferably used as the display device.

Other features which are considered as characteristic for the invention are set forth in the appended claims.

Although the invention is illustrated and described herein as embodied in a method for determining the ability to project images of integrated semiconductor circuits onto alternating phase masks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
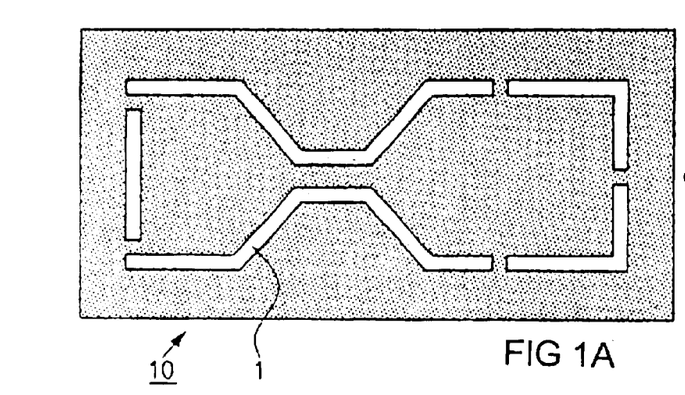
FIG. 1A is an illustration of a dark-field mask according to the invention.
Figure 1B:
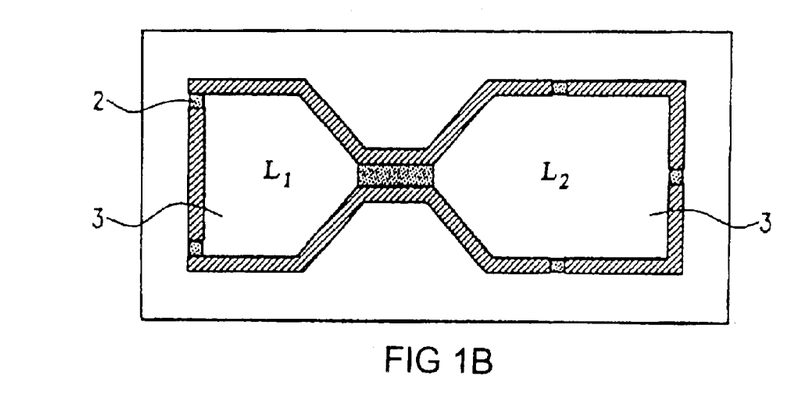
FIG. 1B is an illustration of critical regions determined using the layout.
Figure 1C:
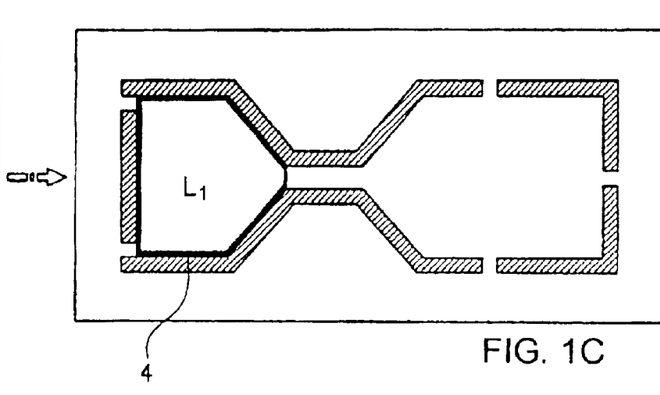
FIG. 1C is an illustration of an outer boundary of a contiguous region in the layout.

Referring now to the figures of the drawing in detail and first, particularly, to FIGS. 1A–2D thereof, there is shown the use of one and the same dark-field mask structure to illustrate the differences between known methods for determining phase conflicts (FIGS. 2A–2D) and the method according to the invention (FIGS. 1A–1C).

Figure 2A:
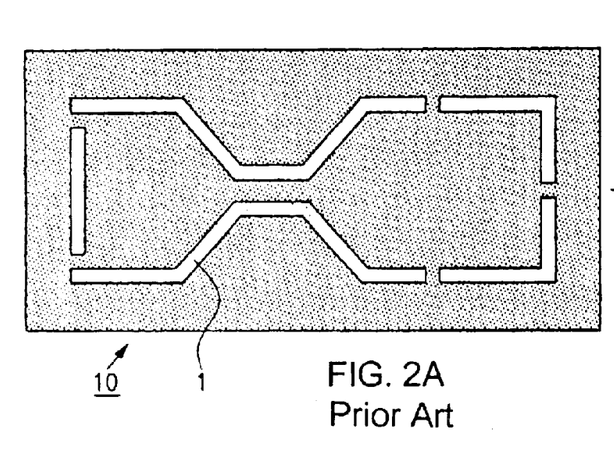
FIG. 2A is an illustration of a dark-field mask.

A dark-field mask 10 has transparent regions 1, which are to be imaged into electrical circuit elements such as interconnects or the like.

Figure 2B:
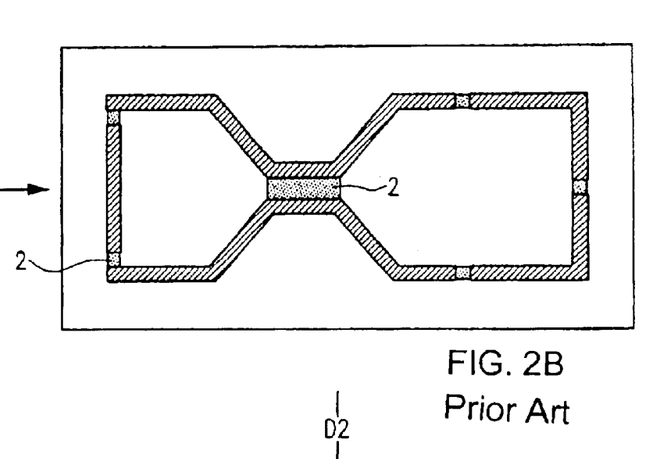
FIG. 2B is an illustration of critical regions determined using the layout.

The transparent regions 1 are illustrated as a hatched polygon progression in FIG. 2B. Situated between the individual sections of the polygon progression are critical regions 2, in which the distance between individual sections of the polygon progression falls below a predetermined minimum value. The task is to allocate to the individual sections of the polygon progression the phases which have a phase difference $\Delta\phi=180°$.

Figure 2C:
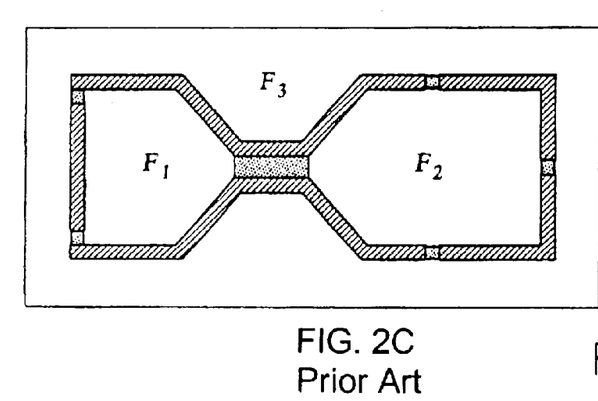
FIGS. 2C–2D are illustrations of results determined by known methods.

The method proceeds from FIG. 2B in accordance with U.S. Pat. No. 5,923,566 in order to determine free spaces $F_1$, $F_2$ and $F_3$, as is illustrated in FIG. 2C. In this case, the free spaces $F_1$ and $F_3$ indicate the same elementary phase conflict determined by $F_1$. $F_3$ is composed of $F_1$ and $F_2$, $F_2$ not representing a phase conflict on account of its even number of interactions (4). Consequently, one and the same phase conflict is unneccessarily indicated twice.

Figure 2D:
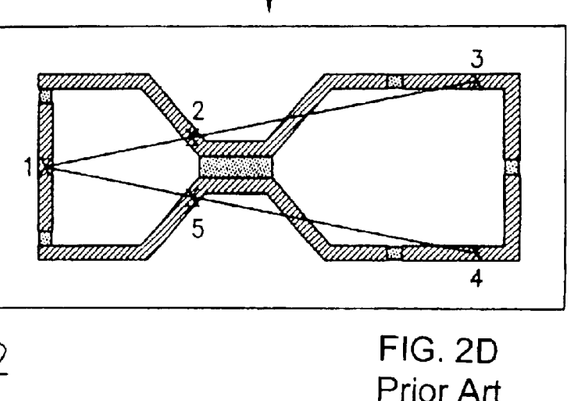

The method described in the reference by Moniwa et al. mentioned in the introduction is illustrated in FIG. 2D and yields the three cycles (1251), (123451) and (23452). Among these cycles, only the first two cycles mentioned have an odd number of nodes and accordingly represent two phase conflicts. The second-mentioned cycle is composed of the other two elementary cycles. Since the third cycle has an even number of nodes, only one phase conflict exists in reality, which phase conflict is determined by the first elementary cycle and is unnecessarily indicated doubly by the second cycle.

By contrast, in the method according to the invention, after the critical regions 2 have been determined, contiguous regions 3 lying outside the transparent and the critical regions 1 and 2 are determined, which are designated as areas $L_1$ and $L_2$ in FIG. 1B. These areas are also referred to as lands below. Afterward, outer boundaries 4 of the lands $L_1$ and $L_2$ are determined and their interactions or stretches of contact with the critical regions 2 are determined. As can be seen in FIG. 1C, the outer boundary of the land $L_1$ unambiguously produces the sole expected phase conflict in an efficient manner. The localized phase conflict is visualized by the outer boundary 4 illustrated as a polygon progression in FIG. 1C. By contrast, the outer boundary around the land $L_2$ does not indicate a phase conflict since the number of stretches of contact with critical regions 2 is even (4).

Figure 3A:
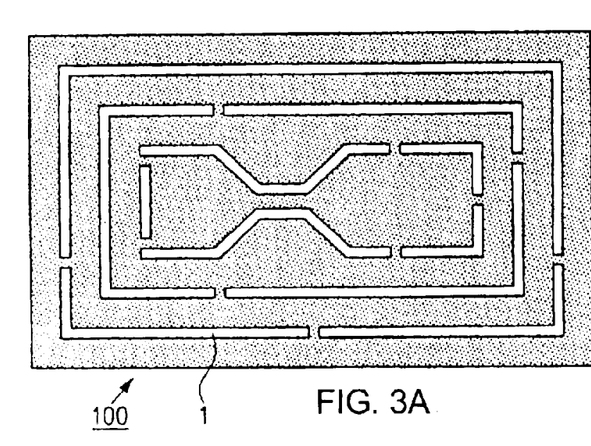
FIG. 3A is an illustration of a further dark-field mask.
Figure 3B:
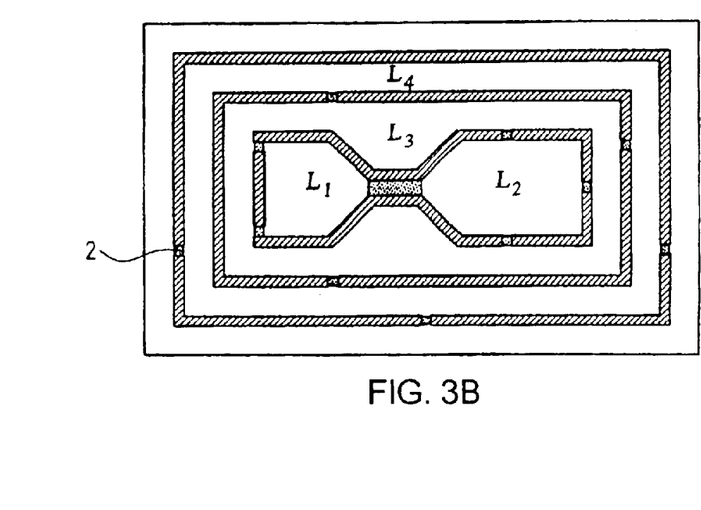
FIG. 3B is an illustration of further critical regions determined using the layout of the dark-field mask.
Figure 3C:
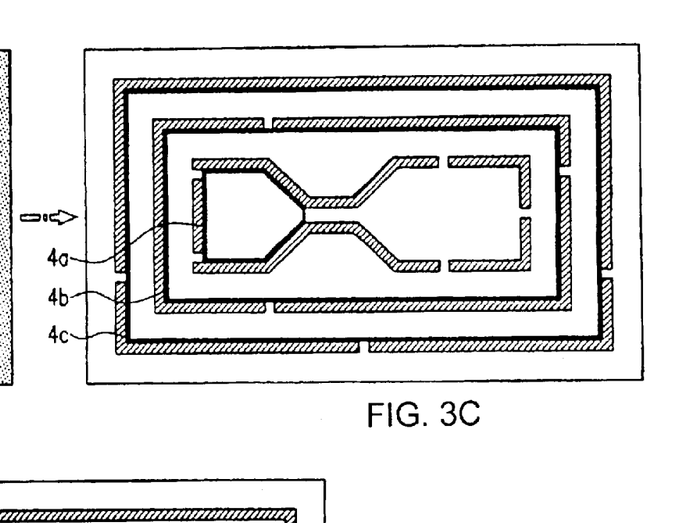
FIG. 3C is an illustration of outer boundaries of contiguous regions.

FIGS. 3A–3C illustrate a more complex dark-field mask 100, which illustrates the inadequacy of the method described in U.S. Pat. No. 5,923,566 in comparison with the present invention. First, in accordance with FIG. 3B, the transparent regions 1 are represented in the form of polygon progressions and critical regions 2 between them are determined. The lands $L_1$ to $L_4$ are then defined as illustrated. In accordance with FIG. 3C, the outer contours 4a, 4b and 4c of the lands that have an odd number of stretches of contact with the critical regions 2 indicate the localized phase conflicts. In the present case, the phase conflict that is localized by the outer boundaries of $L_3$ is not detected by the method taught in U.S. Pat. No. 5,923,566. The reason for this is that the interleaved phase conflict is localized by two free spaces, namely the lands $L_3$ and $L_4$ with even numbers of interactions 8 and 6, respectively. Thus, this example shows the reliability of the method according to the invention compared with the method of taught in U.S. Pat. No. 5,923,566 with regard to dark-field masks.

The dark-field masks described above are shaped in such a way that the critical regions are rectangular or, more generally, trapezoidal sections of different length which extend along one direction. However, the case may also arise where two or more trapezoidal straight sections of this type, which extend in different directions, abut one another. In this case, the determination of overlap regions between the trapezoidal straight sections is added to the determination of lands.

Figure 4A:
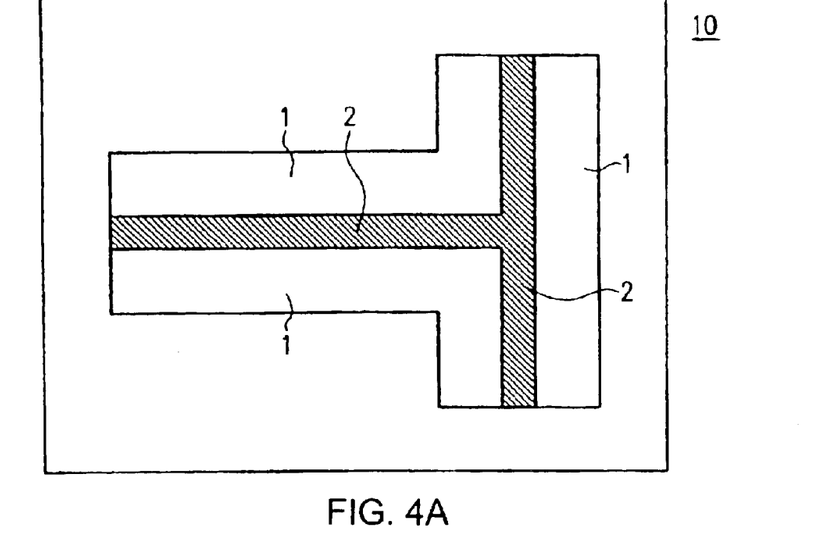
FIG. 4A is an illustration of another dark-field mask with abutting straight sections extending in different directions.
Figures 4B, 4C:
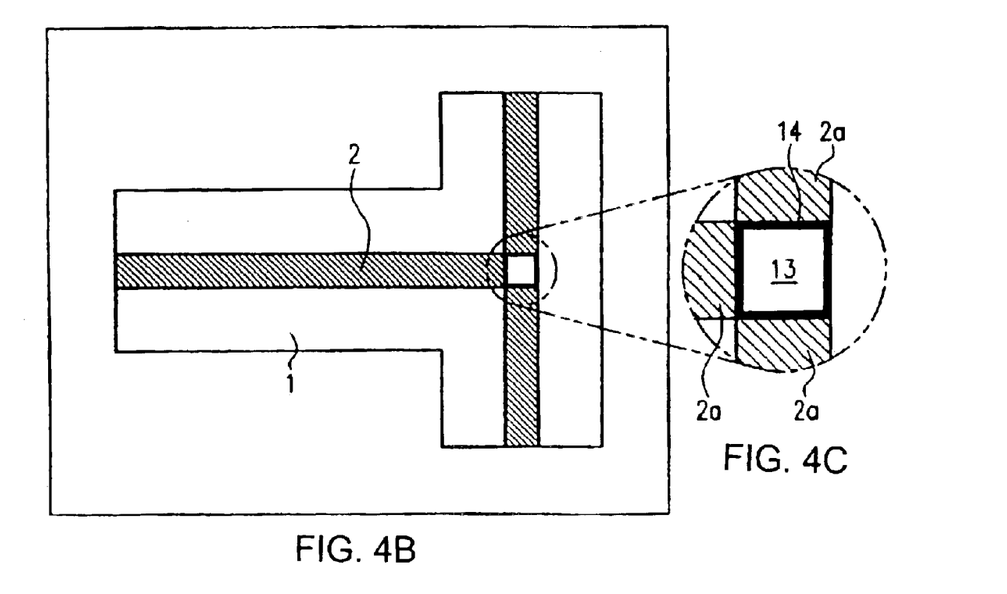
FIG. 4B is an illustration of an additionally depicted overlap region between the straight sections corresponding to FIG. 4A.
FIG. 4C is an enlarged circular detail from FIG. 2B with an outer boundary around an overlap region, which signals a phase conflict.

An example of a phase mask of this type is illustrated in FIGS. 4A–4C. Three transparent regions 1 are disposed relative to one another on the phase mask 10 such that critical regions 2 are produced, within which the transparent regions 1 fall below a predetermined minimum distance from one another. The critical regions 2 form a T-shaped structure, that is to say a structure in which two rectangular straight sections run toward one another and form an overlap region 13. The overlap region 13 is determined by drawing the mutually crossing straight sections beyond the points at which they abut one another, the region jointly enclosed by the continuation lines drawn or the intersection of the continuation lines drawn defining the overlap region 13. In order to determine a degenerate critical region, the overlap region 13 is subtracted from the critical region 2. An outer boundary 14 around the overlap region 13 thus has three stretches of contact with the three degenerate critical regions 2a and thus signals a phase conflict on account of the odd number of stretches of contact.

Figure 5A:
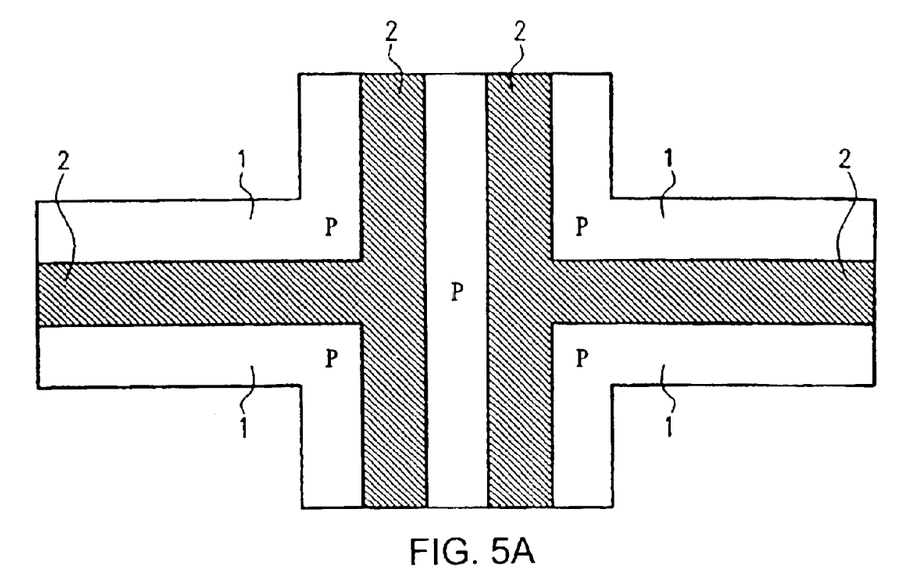
FIG. 5A is an illustration of another dark-field mask which in comparison with FIG. 4 has a double T structure.

A further dark-field mask structure is illustrated in FIG. 5A, which structure exhibits a double T structure (2T structure) in comparison with the single T structure shown in FIG. 4A. In accordance with FIG. 5B, two overlap regions 13 are determined and these are subtracted from the critical, nontransparent regions 2, thereby producing the degenerate critical regions 2a. The outer boundaries 14 around the overlap regions 13 in each case have three stretches of contact with end sections of straight, degenerate critical regions 2a, so that two phase conflicts are thereby indicated. This two-fold phase conflict cannot be detected by the method taught in U.S. Pat. No. 5,923,566 already cited.

Overlap regions 13 of this type do not exist in the case of the dark-field masks of FIGS. 1A to 3C. Consequently, the critical regions are identical to the degenerate critical regions in these cases.

Figure 6A:
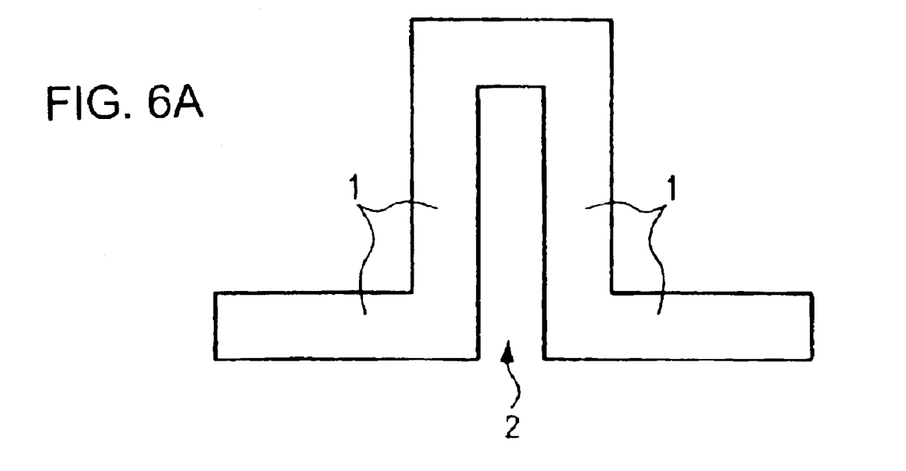
FIG. 6A is an illustration of yet another dark-field mask having an end region.
Figure 6B:
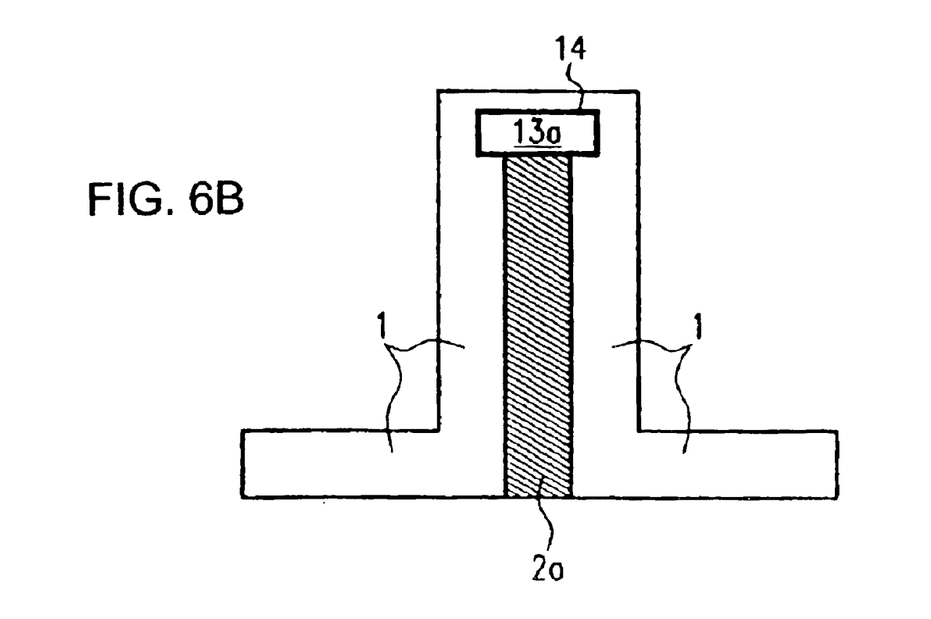
FIG. 6B is an illustration of the dark-field mask with the critical region (hatched) and the boundary around the end region.

FIGS. 6A, 6B illustrate a further dark-field mask, which contains a further type of region containing a phase conflict.

FIG. 6A illustrates the dark-field mask structure, which has a contiguous transparent region 1, which, by way of example, represents an interconnect structure to be imaged by the phase mask and is surrounded by a nontransparent region. The transparent region 1 is shaped in such a way that it encloses, between two path sections, a critical, nontransparent region 2 that falls below a predetermined structure size. The critical region 2 thus ends in the midst of a region containing the transparent region 1. A so-called end region 13a is to be produced in this case. The end region 13a is generated by a line overlying the short side edge of the end section of the critical region 2 being expanded outward by an infinitesimally small amount (sizing operation). The outer boundary 14 is then made around the end region 13a.

Afterward, the degenerate critical regions 2a are generated again, in the manner mentioned, by subtracting overlap regions 13 that are possibly present from the critical regions 2. Since the critical region 2 does not contain an overlap region 13 in the present case, a degenerate critical region 2a (hatched) is generated from it without any alteration. The outer boundary 14 thus has a stretch of contact with the degenerate critical region 2a, so that a phase conflict is indicated by it owing to the odd number of stretches of contact.

The text below illustrates exemplary embodiments in accordance with a second aspect of the method according to the invention with regard to the application to bright-field masks.

Figures 7A, 7B, 7C, 7D, 7E:
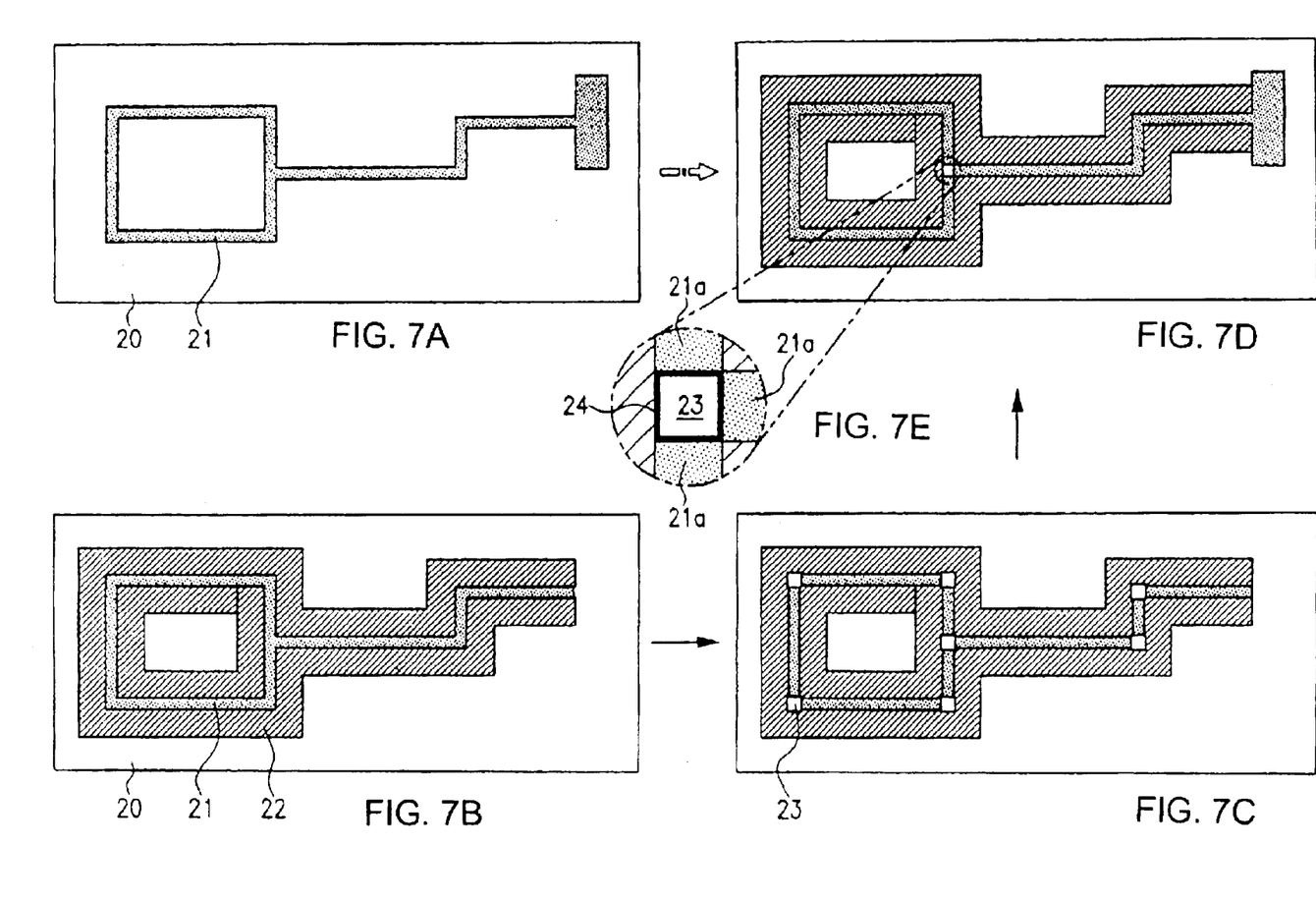
FIG. 7A is an illustration of a bright-field mask.
FIG. 7B is an illustration which additionally depicted phase-shifting elements around the nontransparent, critical structure regions of the mask.
FIG. 7C is an illustration of additionally depicted overlap regions between the straight sections of the nontransparent, critical structure regions of the mask.
FIG. 7D is an illustration of an additionally depicted outer boundaries around contiguous regions or overlap regions, which result in phase conflicts.
FIG. 7E is an illustration of an enlarged circular detail from FIG. 7D of an outer boundary around an overlap region, which signals a phase conflict.

FIG. 7A illustrates a simple exemplary embodiment of a bright-field mask structure 20, which contains nontransparent regions 21 against a transparent background. In accordance with FIG. 7B, phase-shifting elements 22 (shown hatched) are defined on both sides of the nontransparent, critical regions 21. The critical regions 21 are held to be those regions that fall below a specific, predetermined minimum width or minimum structure size. The phase-shifting elements can be defined, by way of example, as in U.S. Pat. No. 5,537,648 (FIG. 6 and associated description text). With regard to this procedure, U.S. Pat. No. 5,537,648 is incorporated by reference into the disclosure content of the present application.

Figure 5B:
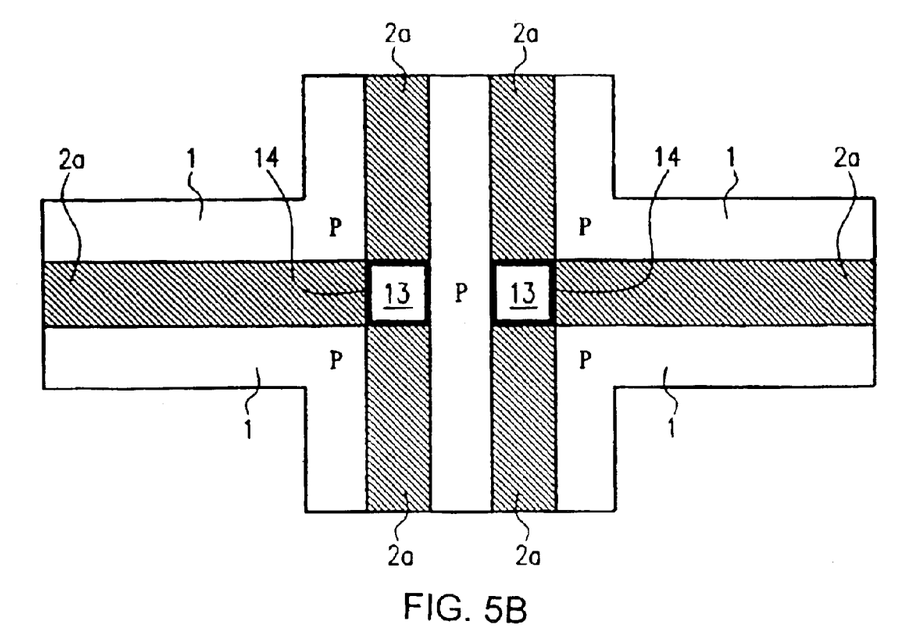
FIG. 5B is an illustration of the mask structure with additionally depicted overlap regions and outer boundaries.

Afterward, in accordance with FIG. 7C, overlap regions 23 between straight sections of the critical regions 21 are determined in precisely the same way as already described in connection with the dark-field mask of FIGS. 5A–5B. The overlap regions are determined as follows.

The case may arise where two or more trapezoidal, straight sections that extend in different directions abut one another. The determination of overlap regions between the trapezoidal straight sections is of importance in this case. One example of this is the T-shaped structure shown enlarged in FIG. 7E. The nontransparent regions 21 form a T-shaped branching structure, that is to say a structure in which two—in this example—rectangular, straight sections run toward one another and form the overlap region 23. The overlap region 23 can be defined for example by drawing the mutually crossing straight sections beyond the points at which they abut one another, the region jointly enclosed by the continuation lines or the intersection of the continuation lines drawn defining the overlap region 23. In order to determine the degenerate critical region, the overlap region 23 is subtracted from the nontransparent critical regions 21. An outer boundary 24 around the overlap region 23 thus has three stretches of contact with three degenerate critical regions 21a and thus signals a phase conflict on account of the odd number of stretches of contact.

The degenerate critical regions 21a are generated by subtracting the overlap regions 23 from the critical regions 21. The outer boundaries 24 with respect to the overlap regions 23 and lands are then generated, as can be seen in the circular detail of FIG. 7E. A phase conflict is present precisely when the outer boundary 24 has an odd number of interactions or stretches of contact with degenerate critical regions 21a. In accordance with FIG. 7E, the outer boundary 24 around the overlap region 23 is in contact with the three degenerate critical regions 21a and thus unambiguously signals a T phase conflict.

The phase conflict is not detected by the method in accordance with the reference by Moniwa et al. because no cycle is produced upon application of the non-directional conflict graph, specifically since only two phase-shifting elements and one contiguous critical structure are present.

FIGS. 8 to 11 illustrate the action of the method according to the invention in accordance with its second aspect on the basis of a more complex bright-field mask structure.

Figure 8:
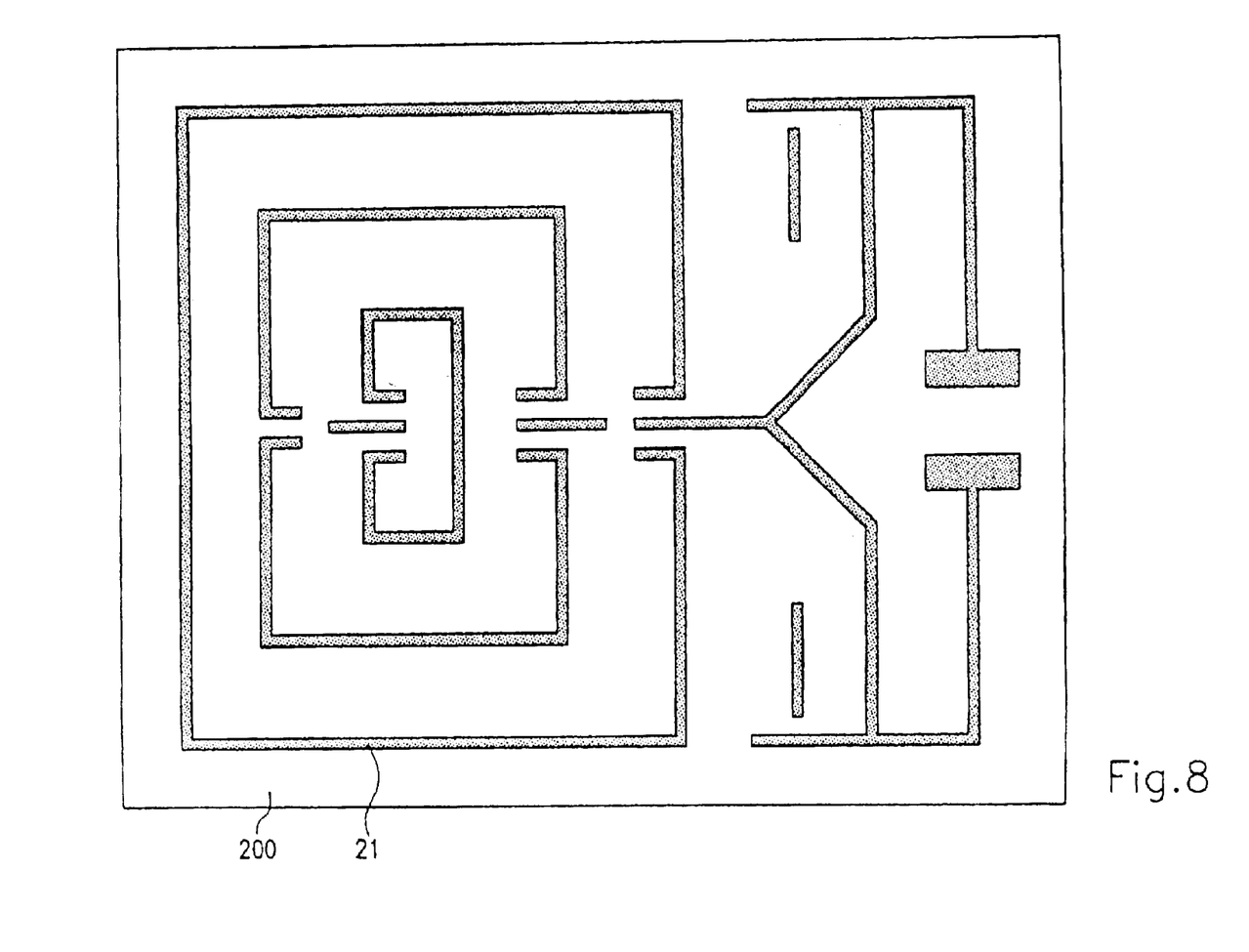
FIG. 8 is an illustration of a further example of a bright-field mask structure to be treated according to the invention.
Figure 9:
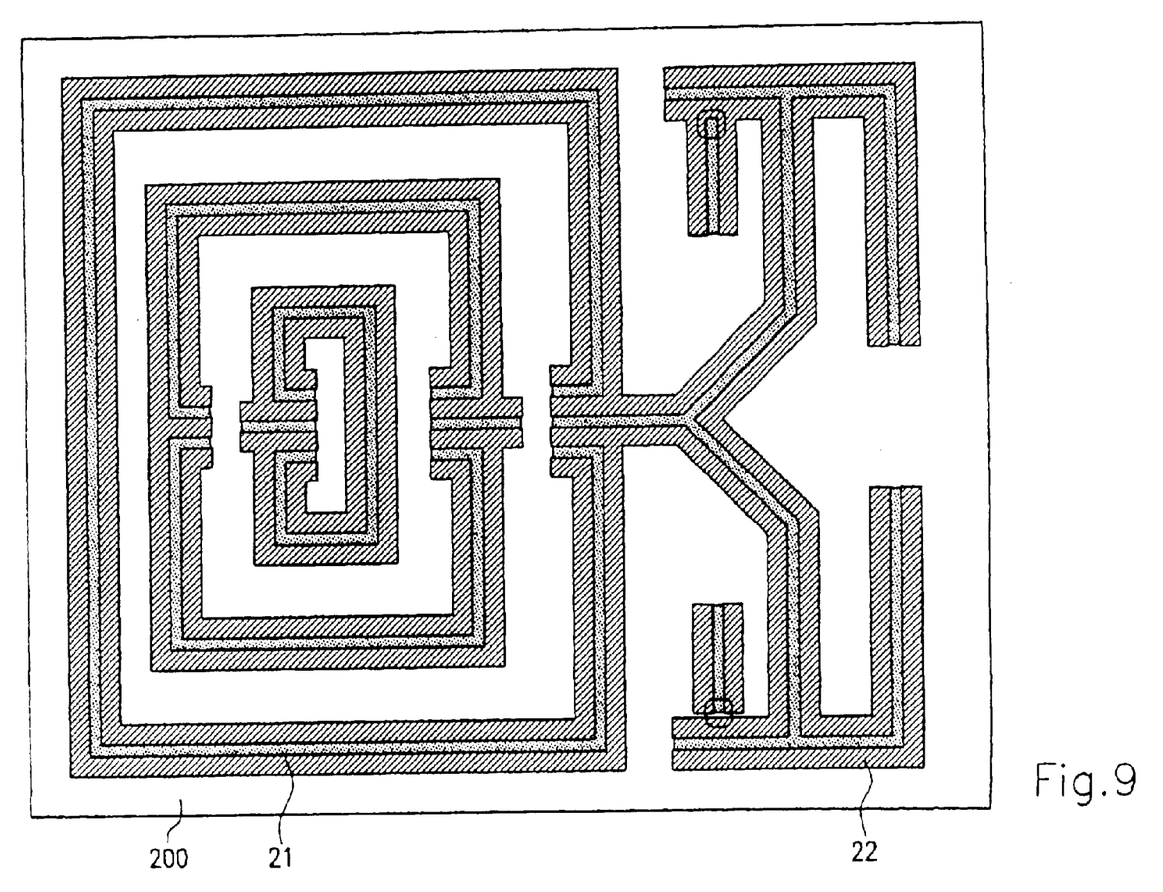
FIG. 9 is an illustration of a bright-field mask with additionally depicted phase-shifting elements around the nontransparent, critical structure regions.

First, FIG. 8 illustrates a bright-field mask 200 with the nontransparent regions 21, which are to be imaged into circuit elements such as interconnects or the like. In accordance with FIG. 9, in the manner already explained, the phase-shifting elements 22 (hatched polygons) are determined on both sides of the straight sections of the nontransparent regions 21, since the nontransparent regions 21 are classified as critical thereby defining critical regions 21.

Figures 10A, 10B, 10C:
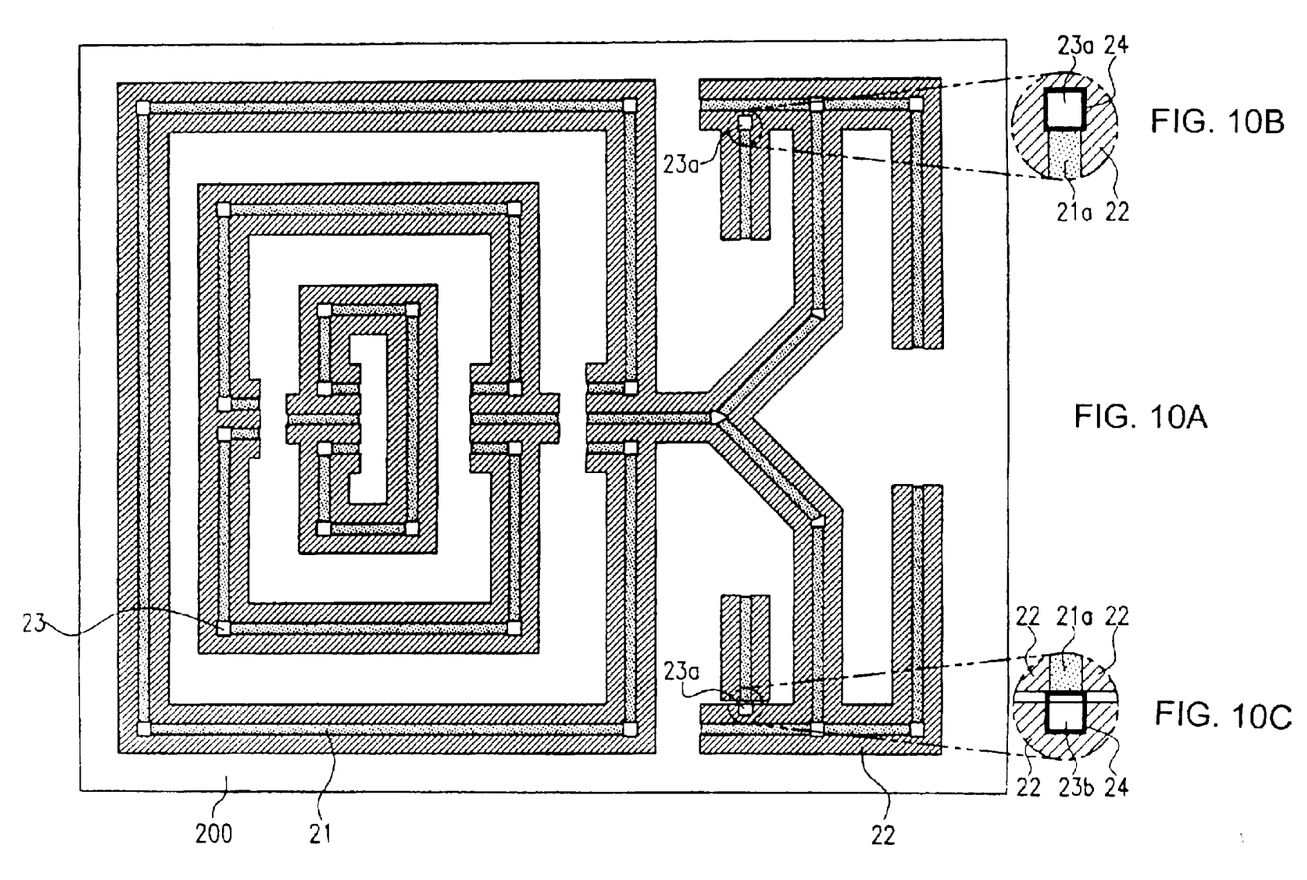
FIG. 10A is an illustration of the bright-field mask shown in FIG. 9 with additionally depicted overlap regions (light) between straight sections of the nontransparent, critical structure regions.
FIG. 10B is an enlarged circular illustration of a detail from FIG. 10A showing a first end region.
FIG. 10C is an enlarged circular illustration of a detail from FIG. 10A showing a second end region.

The bright-field mask 200 exhibits two further types of regions in addition to the lands and the overlap regions 23 (FIG. 10A). Whenever straight sections of the nontransparent regions 21 end in the midst of a phase-shifting element 22, a so-called end region 23a is to be generated. The latter is generated simply by, as shown in the circularly enlarged detail of FIG. 10B, a line overlying the short side edge of the end section of the nontransparent region 21 being expanded outward by an infinitesimally small amount, "sizing operation". The outer boundary 24 is then made around the end region 23a and makes contact with the short side edge of the end section of the nontransparent region 21. Furthermore, as can be seen in the circularly enlarged detail of FIG. 10C, an end region 23b is to be generated where a critical region 21 ends at a critical interaction region. Critical interaction regions are regions between phase-shifting elements 22 in which a predetermined distance between the phase-shifting elements 22 is undershot. The end region 23b is likewise generated by a "sizing operation" by, as shown in the circularly enlarged detail of FIG. 10C, a line overlying the short side edge of the end section of the nontransparent region 21 being expanded outward by an infinitesimally small amount. The outer boundary 24 made around the end region 23b thus makes contact with the short side edge of the end section of the nontransparent region 21.

The overlap regions 23 between straight sections of the nontransparent regions 21 and end regions 23a, 23b of straight sections which end in the midst of the phase-shifting element 22 or an interaction region are thus determined in accordance with FIGS. 10A–10C. Degenerate critical regions are then defined by subtracting the overlap regions 23 from the nontransparent regions 21. In accordance with FIG. 11, phase conflicts are indicated by the outer boundaries 24 of lands, overlap regions 23 or end regions 23a, 23b which make contact with an odd number of end sections of the degenerate critical regions derived from the nontransparent mask fields 21. The end regions 23a, 23b thus always signal a phase conflict since they make contact with precisely one end section of the nontransparent region 21.

Figure 11:
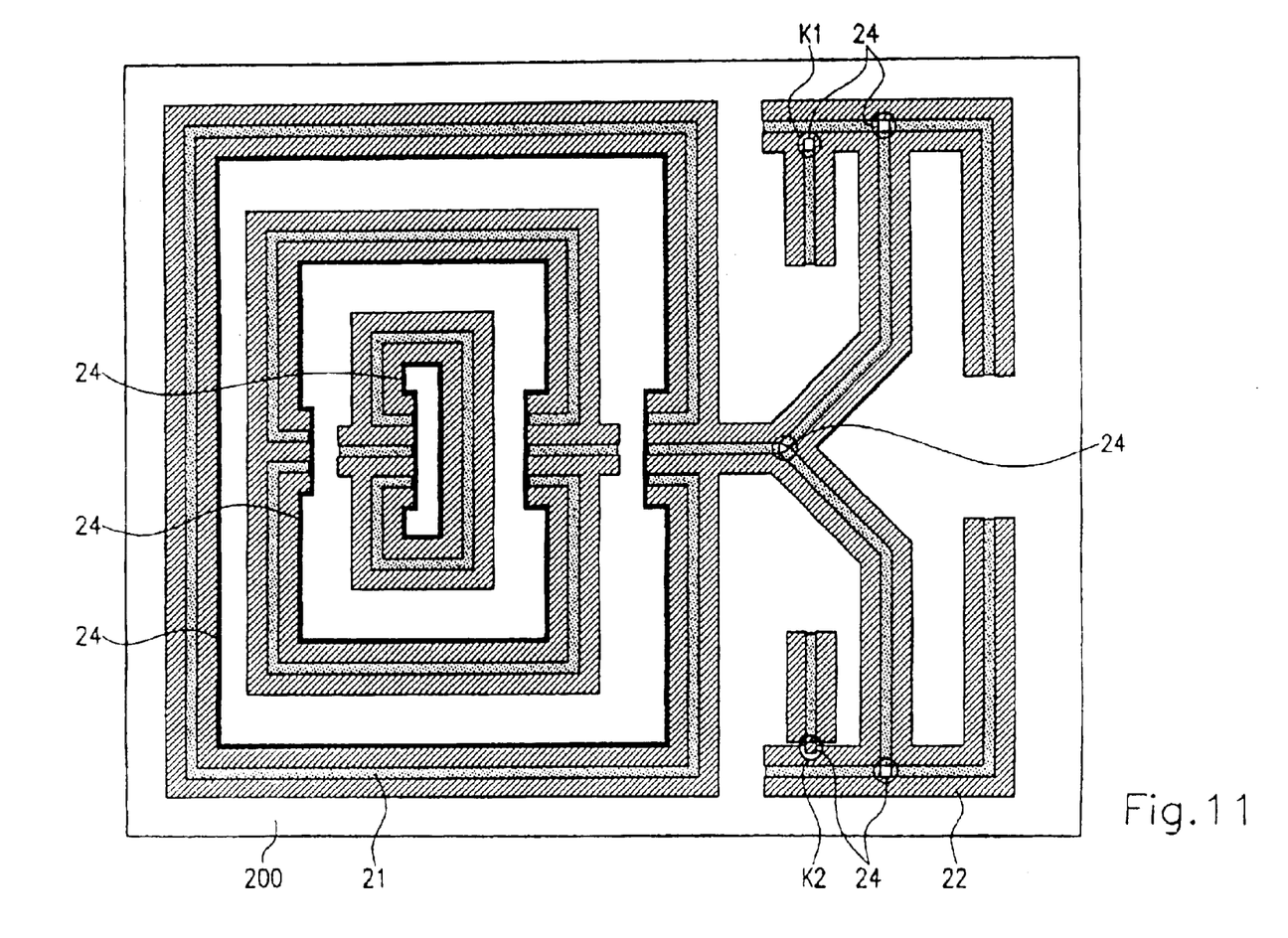
FIG. 11 is an illustration of the bright-field mask of FIG. 9 with additionally depicted outer boundaries around contiguous regions and overlap regions.

Consequently, FIG. 11 reveals the eight unambiguously localized phase conflicts 24 with respect to the bright-field mask structure of FIG. 8 using the eight dark outer boundaries 24. The second phase conflict that is interleaved on the left-hand side of the FIG. 11 cannot be detected by the method of U.S. Pat. No. 5,923,566 since the two free spaces adjoining it are assigned even numbers of interactions 6 and 4. Consequently, there are two types of so-called end region conflicts K1 and K2. An end region conflict is present precisely when the corresponding line ends in the midst of the phase-shifting element 22 (K1) or a critical interaction region between two phase-shifting elements 22 (K2). These two types of end region conflicts are depicted in FIG. 11.

Figure 12:
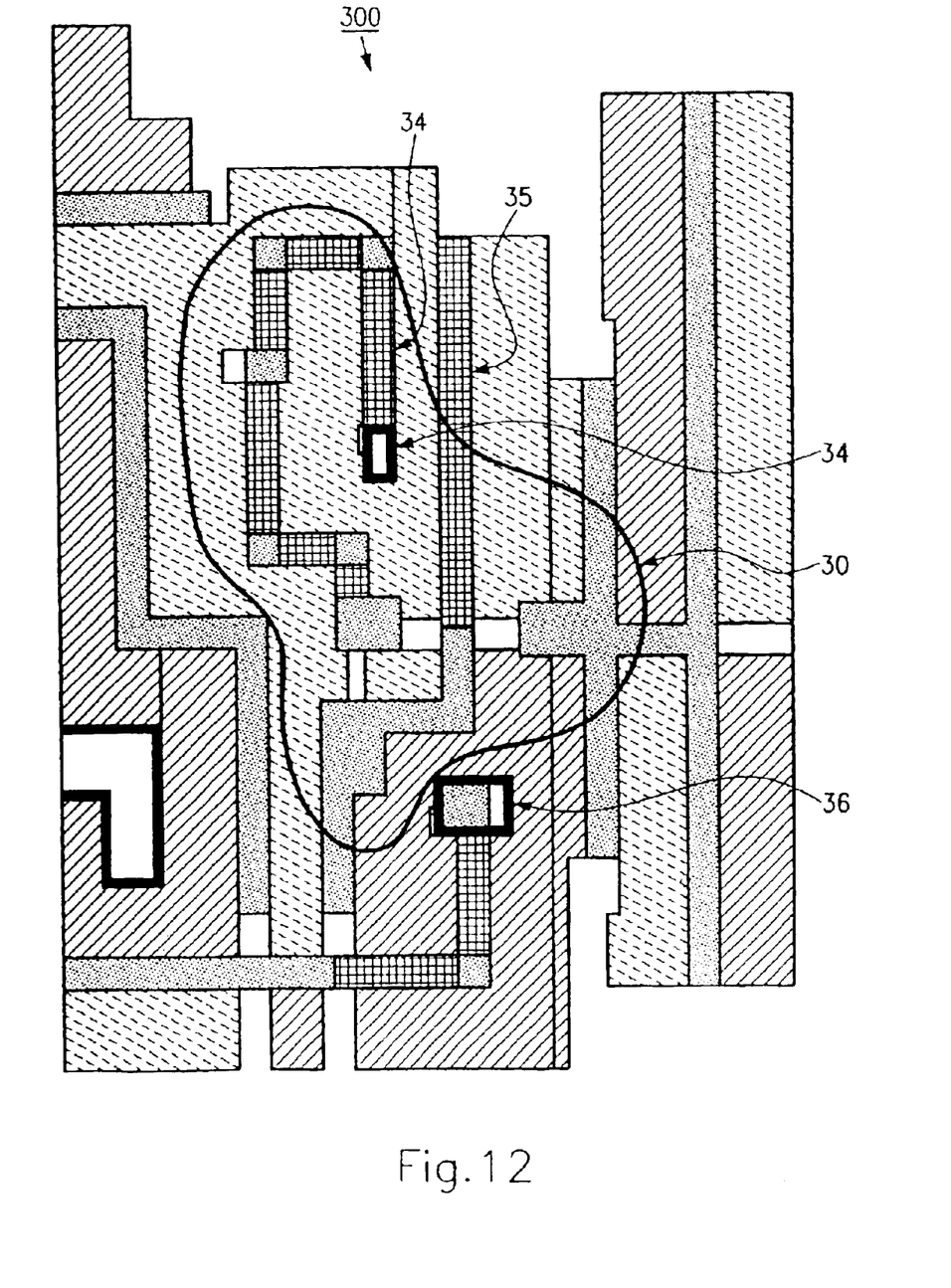
FIG. 12 is an illustration of a detail from a gate plane that is to be produced using a bright-field phase mask.

FIG. 12 illustrates a detail from a gate plane that is intended to be produced using a bright-field phase mask. The interconnects of minimal width which are represented therein are critical structures and must therefore be realized by phase elements disposed on both sides, while the widened portions (contact pads or landing pads) do not have critical widths.

Generated phase-shifting elements are represented on both sides of the interconnects, the elements having the two different phases 0° and 180° and, accordingly, being identified by two different hatchings. What are marked in a chessboard-like manner are the parts of interconnects (gates in this case) which cannot be correctly imaged in the case of the phase allocation presented, since both sides of the gate are exposed with the same phase. In FIG. 12, they are designated as phase conflicts 34 and 35 lying within the boundary 30. A further phase conflict 36 lies outside the boundary 30.

The cause of the left-hand phase conflict of the two non-localized phase conflicts can be seen in the fact that the affected gate adjoins the same phase shifter at both sides. The cause of the right-hand phase conflict cannot be seen as easily. The question arises as to why a phase allocation that avoids the phase conflict cannot be found. The cause lies in the cycle exhibited by the boundary 30. Five critical gates and continuously five phase shifters are lined up along this path. The phase shifters encountered by this path cannot alternately be allocated to the two phases. This fact can easily be demonstrated with the aid of the boundary 30. It is only by virtue of the method according to the invention that clear indication is given, however, that actually only one phase conflict, rather than two, is present in the discussed part of the detail.

In a practical application of the method according to the invention, the phase conflicts determined are visualized on a display device such as a screen by highlighting the polygons or large outer boundaries that correspond to the phase conflicts.

We claim:

1. A method for determining an ability to project images of integrated semiconductor circuits onto alternating dark-field phase masks and for determining possible phase conflicts, to project images of electrical circuit elements such as interconnects and similar items into transparent regions of a phase mask, which comprises the steps of:

determining critical regions, a critical region being identified for each case in which a distance between two adjacent transparent regions provided for the phase mask falls below a specific predetermined minimum distance;

determining overlap regions between straight sections of the critical regions and determining end regions of the straight sections of the critical regions, the end regions of the straight sections ending in a midst of the transparent regions;

determining degenerate critical regions by subtracting the overlap regions from the critical regions;

determining contiguous regions lying outside the transparent regions and the critical regions;

determining outer boundaries for each of the contiguous regions, for each of the overlap regions and for each of the end regions;

determining a number of stretches of contact with the degenerate critical regions for each of the outer boundaries determined for each of the contiguous regions, for each of the overlap regions and for each of the end regions; and determining a presence of a phase conflict if the number of stretches is an odd number for any of the outer boundaries.

2. The method according to claim 1, further comprising the steps of:

resolving the phase conflict by allocating two different phases with a phase difference $\Delta\phi=180°$ to a respective transparent region involved in the phase conflict; and carrying out an exposure step for exposing a boundary line between two phase regions.

3. The method according to claim 1, further comprising the step of resolving the phase conflict by altering a circuit structure.

4. The method according to claim 1, further comprising the step of resolving the phase conflict by using more than two different phases.

5. The method according to claim 1, further comprising the step of visualizing the phase conflict on a display device by highlighting one of polygons and an outer contour corresponding to the phase conflict.

6. The method according to claim 5, further comprising the step of using a screen as the display device.

7. A method for determining an ability to project images of integrated semiconductor circuits onto alternating bright-field phase masks and for determining possible phase conflicts, to project images of electrical circuit elements such as interconnects and similar items into nontransparent regions of a phase mask, which comprises the steps of:

determining phase-shifting regions in each case on both sides of nontransparent, critical regions provided for the phase mask;

determining overlap regions between straight sections of the nontransparent critical regions and determining end regions of the straight sections of the nontransparent critical regions, the straight sections ending in one of a midst of the phase-shifting regions and critical interaction regions between the phase-shifting regions;

determining degenerate critical regions by subtracting the overlap regions from the nontransparent, critical regions;

determining contiguous regions lying outside the phase-shifting regions and the nontransparent, critical regions;

determining outer boundaries for each of the contiguous regions, for each of the overlap regions and for each of the end regions;

determining a number of stretches of contact with the degenerate critical regions for each of the outer boundaries obtained for each of the contiguous regions, for each of the overlap regions and for each of the end regions; and determining a presence of a phase conflict if the number of stretches is odd for any of the outer boundaries.

8. The method according to claim 7, further comprising the steps of:

resolving the phase conflict by allocating two different phases with a phase difference $\Delta\phi=180°$ to a respective phase-shifting element involved in the phase conflict; and carrying out an exposure step for exposing a boundary line between two phase regions.

9. The method according to claim 7, further comprising the step of resolving the phase conflict by altering a circuit structure.

10. The method according to claim 7, further comprising the step of resolving the phase conflict by using more than two different phases.

11. The method according to claim 7, further comprising the step of visualizing the phase conflict on a display device by highlighting one of polygons and an outer contour corresponding to the phase conflict.

12. The method according to claim 11, further comprising the step of using a screen as the display device.

13. A method for determining an ability to project images of integrated semiconductor circuits onto alternating dark-field phase masks and for determining possible phase conflicts, to project images of electrical circuit elements such as interconnects and similar items into transparent regions of a phase mask, which comprises the steps of:

determining critical regions, a critical region being identified for each case in which a distance between two adjacent transparent regions provided for the phase mask falls below a specific predetermined minimum distance;

determining degenerate critical regions by subtracting overlap regions between straight sections of the critical regions from the critical regions and from end regions of the straight sections of the critical regions, the end regions of the straight sections ending in a midst of the transparent regions;

determining contiguous regions lying outside the transparent regions and the critical regions;

determining outer boundaries for each of the contiguous regions, for each of the overlap regions and for each of the end regions;

determining a number of stretches of contact with the degenerate critical regions for each of the outer boundaries determined for each of the contiguous regions, for each of the overlap regions and for each of the end regions; and determining a presence of a phase conflict if the number of stretches is an odd number for any of the outer boundaries.

14. A method for determining an ability to project images of integrated semiconductor circuits onto alternating bright-field phase masks and for determining possible phase conflicts, to project images of electrical circuit elements such as interconnects and similar items into nontransparent regions of a phase mask, which comprises the steps of:

determining phase-shifting regions in each case on both sides of nontransparent, critical regions provided for the phase mask;

determining degenerate critical regions by subtracting overlap regions between straight sections of the nontransparent critical regions from the nontransparent critical regions and from end regions of the straight sections of the nontransparent critical regions, the straight sections ending in one of a midst of the phase-shifting regions and critical interaction regions between the phase-shifting regions;

determining contiguous regions lying outside the phase-shifting regions and the nontransparent, critical regions;

determining outer boundaries for each of the contiguous regions, for each of the overlap regions and for each of the end regions;

determining a number of stretches of contact with the degenerate critical regions for each of the outer boundaries obtained for each of the contiguous regions, for each of the overlap regions and for each of the end regions; and determining a presence of a phase conflict if the number of stretches is odd for any of the outer boundaries.

* * * * *